(12) United States Patent
Nandakumar et al.

(10) Patent No.: US 7,772,094 B2
(45) Date of Patent: Aug. 10, 2010

(54) IMPLANT DAMAGE OF LAYER FOR EASY REMOVAL AND REDUCED SILICON RECESS

(75) Inventors: Mahalingam Nandakumar, Richardson, TX (US); Wayne Bather, Silver Springs, MD (US); Narendra Singh Mehta, Dallas, TX (US)

(73) Assignee: Texas Instuments Incorporated, Dallas, TX (US)

( * ) Notice: Subject to any disclaimer, the term of this patent is extended or adjusted under 35 U.S.C. 154(b) by 0 days.

(21) Appl. No.: 12/345,414

(22) Filed: Dec. 29, 2008
(Under 37 CFR 1.47)

(65) Prior Publication Data
US 2009/0170277 A1     Jul. 2, 2009

Related U.S. Application Data

(60) Provisional application No. 61/017,355, filed on Dec. 28, 2007.

(51) Int. Cl.
*H01L 21/322* (2006.01)
(52) U.S. Cl. .................. 438/473; 438/514; 438/528; 257/607; 257/E21.214
(58) Field of Classification Search ........... 438/514, 438/517, 526, 528, 531, 551, 552, 783, 471–476; 257/607, 610, E21.214
See application file for complete search history.

(56) References Cited

U.S. PATENT DOCUMENTS

| 5,883,011 | A | 3/1999 | Lin et al. |
| 6,121,133 | A | 9/2000 | Iyer et al. |
| 6,403,151 | B1 | 6/2002 | Davis et al. |
| 7,115,524 | B2 | 10/2006 | Honeycutt et al. |
| 7,229,891 | B2 * | 6/2007 | Coleman .................. 438/402 |

* cited by examiner

*Primary Examiner*—Hsien-ming Lee
(74) *Attorney, Agent, or Firm*—Jaqueline J. Garner; Wade J. Brady, III; Frederick J. Telecky, Jr

(57) ABSTRACT

A method for semiconductor processing is provided, wherein a removal of one or more layers is aided by structurally weakening the one or more layers via ion implantation. A semiconductor substrate is provided having one or more primary layers formed thereon, and a secondary layer is formed over the one or more primary layers. One or more ion species are implanted into the secondary layer, therein structurally weakening the secondary layer, and a patterned photoresist layer is formed over the secondary layer. Respective portions of the secondary layer and the one or more primary layers that are not covered by the patterned photoresist layer are removed, and the patterned photoresist layer is further removed. At least another portion of the secondary layer is removed, wherein the structural weakening of the secondary layer increases a removal rate of the at least another portion of the secondary layer.

29 Claims, 8 Drawing Sheets

IMPLANT DAMAGE OF LAYER FOR EASY REMOVAL AND REDUCED SILICON RECESS

RELATED APPLICATION

This application claims the priority of U.S. Provisional Application Ser. No. 61/017,355, filed Dec. 28, 2007, entitled "Implant Damage of Layer for Easy Removal and Reduced Silicon Recess".

FIELD OF THE INVENTION

The present invention relates generally to semiconductor processing, and more particularly to a method for improving removal rates of a layer formed over a substrate.

BACKGROUND OF THE INVENTION

In the fabrication of semiconductor integrated circuits (ICs), various structures and circuitry are typically formed on a semiconductor workpiece using a variety of techniques. For instance, various structures are formed, defined and/or electrically isolated from one another in the semiconductor workpiece utilizing various masking and etching processes. As feature sizes become smaller and smaller to accommodate increasing device densities, proper process control is of great importance.

One common technique utilized in defining structures is photolithography. In optical photolithography, for example, an optical mask is typically utilized to produce a pattern in a photoresist layer, wherein the photoresist layer overlies one or more other layers previously formed over a semiconductor substrate. The optical mask is positioned between the photoresist layer and a radiation source, and the photoresist layer is subjected to radiation, such as a visible light or ultraviolet radiation. Portions of the optical mask conventionally comprise a patterned opaque layer, (e.g., chromium), wherein the opaque layer prevents exposure of the underlying photoresist layer. Remaining portions of the optical mask, on the other hand, are transparent, thus allowing exposure of the underlying photoresist layer. Accordingly, an image of the optical mask is reproduced on the photoresist layer via the exposure of the photoresist layer to the radiation through the optical mask.

After exposure, a developer solution is typically introduced to the workpiece, wherein, depending on the type of photoresist material utilized (e.g., positive type or negative type), exposed photoresist material is either removed by the developer solution, or the exposed photoresist material becomes more resistant to dissolution by the developer solution. Thus, a patterned photoresist layer is accordingly formed over the one or more layers, wherein portions of the one or more layers are generally exposed. Material from the one or more layers is then selectively removed, such as by wet or dry etching, therein defining the desired various structures in the workpiece. Adequate control of both the photolithographic process, as well as the etch processes is thus important in achieving the desired resultant semiconductor device(s).

One problem experienced with conventional optical photolithography is a difficulty of obtaining uniform exposure of the photoresist layer underlying transparent portions of the mask. Generally, it is desirable that the light intensity exposing the photoresist be uniform to obtain optimum results. When substantially thick layers of photoresist material are used, the photoresist layer becomes partially transparent upon exposure, such that photoresist material at the surface of the underlying one or more layers is exposed a substantially similar extent as the photoresist at the outer surface. However, light that penetrates the photoresist is often reflected back toward the light source from the surface of the underlying one or more layers formed on the substrate. The angle at which the light is reflected is generally dependent on the topography of the surface of the underlying one or more layers and the type of material of the one or more layers. Further, the reflected light intensity can vary in the photoresist layer throughout its depth or partially though its depth, leading to non-uniform exposure and/or undesirable exposure of the photoresist material. Such exposure of the photoresist layer can lead to poorly controlled dimensions on features (e.g., gates, metal lines, etc.) of the IC.

In an attempt to minimize the variable reflection of light in a photoresist layer, antireflective coatings have been utilized. For example, an antireflective coating is formed over the one or more layers of the workpiece prior to the formation of the photoresist layer. Such antireflective coatings minimize photoresist exposure from surface reflections, and allow exposure across the photoresist layer to be controlled more easily from the radiation emitted from the radiation source incident on the photoresist material.

Antireflective coatings can comprise organic or inorganic materials. For example, inorganic materials, such as silicon-rich silicon dioxide, silicon-rich nitride, and silicon-rich oxynitride, have been utilized quite successfully as antireflective coatings, such as in the patterning of metal lines and polysilicon gates. FIGS. 1A-1C illustrate an exemplary semiconductor workpiece 10 during several stages of photolithographic processing. The workpiece 10 comprises a semiconductor substrate 12 having a gate oxide layer 14 and a polysilicon layer 16 formed thereon. As illustrated in FIG. 1A, a conventional inorganic antireflective coating (IARC) layer 18 has been formed over the polysilicon layer 16, and a photoresist layer 20 has been patterned over the IARC layer, using the advantageous antireflective properties of the IARC layer to more accurately define the patterned photoresist layer. The photoresist layer 20 thus defines exposed portions 22 of the IARC layer 18.

FIG. 1B illustrates the result of a conventional etch process, wherein the IARC layer 18, polysilicon layer 16, and gate oxide layer 14 is etched in the exposed portions 22 of FIG. 1A, and wherein the etch continues into the semiconductor substrate 12 by a first etch depth 24, typically on the order to 10-20 angstroms. The photoresist layer 20 is also shown as being removed in FIG. 1B, as the presence of the photoresist layer is no longer necessary or desired.

The IARC layer 18 is likewise unnecessary and undesirable for further processing. Accordingly, FIG. 1C illustrates the result of removing the IARC layer 18, wherein the IARC layer has been stripped or etched from the workpiece 10 by hot phosphoric acid. Conventionally, stripping of the IARC layer 18 is a relatively lengthy process, and during the hot phosphoric acid stripping of the IARC layer, the semiconductor substrate 12 is further removed to a second etch depth 26, typically on the order of 40-50 angstroms. As a result of the relatively long stripping of the IARC layer 18 in hot phosphoric acid, the relatively large second etch depth 26 can lead to transistor performance losses and other undesirable effects.

A well known electrical isolation technique is called trench isolation. In trench isolation, a trench is etched in the substrate and then filled with deposited oxide. Trench isolation is referred to as shallow trench isolation (STI) or deep trench isolation (DTI), depending on the depth of the trench etched in the substrate. FIGS. 2A-2C illustrate another workpiece 30 undergoing shallow trench isolation processing, wherein a pad oxide layer 32 is traditionally grown over a semiconductor substrate 34 and a nitride layer 36 is deposited over the pad oxide layer. A photoresist layer 38 illustrated in FIG. 2A is again utilized to pattern the nitride layer 36, the pad oxide layer 32, and the semiconductor substrate 34 (e.g., via an etch process), wherein the resultant structure is illustrated in FIG. 2B (the photoresist layer 38 has also been removed).

Subsequently, the nitride layer 36 is "pulled back" (e.g., via hot phosphoric acid) to reveal corners 40 of the semiconductor substrate 34 for subsequent oxidation treatment, as illustrated in FIG. 2C. The "pull back" of the nitride layer 36, however, further etches the semiconductor substrate 34, wherein active regions 42 of the semiconductor substrate are etched, therein causing critical dimension (CD) losses 44 in the active regions, wherein performance can be negatively impacted.

SUMMARY OF THE INVENTION

Accordingly, a method for semiconductor processing is provided that overcomes critical dimension losses and other shortcomings of the related art. The following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present disclosure is generally directed toward a method for semiconductor processing, wherein a semiconductor substrate having one or more primary layers formed thereon is provided, therein generally defining a semiconductor workpiece. A secondary layer is formed over the one or more primary layers, and one or more species of ions are implanted into the secondary layer, therein structurally weakening the secondary layer. A patterned photoresist layer is formed over the secondary layer, and respective portions of the secondary layer and the one or more primary layers that are not covered by the patterned photoresist layer are removed, such as by etching. The patterned photoresist layer is then removed, and at least another portion of the secondary layer is removed, wherein the structural weakening of the secondary layer caused by the ion implantation generally increases a removal rate of the at least another portion of the secondary layer.

In accordance with one aspect, the one or more primary layers, for example, comprise a polysilicon layer formed over an oxide layer, such as a gate oxide layer, wherein the secondary layer comprises an inorganic antireflective coating formed over the polysilicon layer. Accordingly, in this example, the removal of at least another portion of the secondary layer comprises removing all of the remaining inorganic antireflective coating. The removal of the at least another portion of the secondary layer, for example, comprises etching at least the secondary layer with hot phosphoric acid. The removal of respective portions of the secondary layer and the one or more primary layers that are not covered by the patterned photoresist layer may further comprise removing at least a portion of the semiconductor substrate not covered by the patterned photoresist layer.

In accordance with another aspect, the secondary layer comprises a nitride layer, such as a shallow trench isolation nitride layer, and wherein the one or more primary layers comprise a pad oxide layer. In this example, the one or more species of ions are implanted into the nitride layer, thus structurally weakening the nitride layer. In another example, removing at least another portion of the secondary layer comprises etching the nitride layer a predetermined amount using hot phosphoric acid, thus exposing corners of active semiconductor substrate disposed thereunder. The removal of at least another portion of the secondary layer may further comprise undercutting the pad oxide layer a predetermined amount using diluted hydrofluoric acid. It is noted that once the nitride is structurally weakened and the at least another portion of the nitride layer is removed, further annealing of the workpiece may take place, where the nitride layer is strengthened.

In accordance with another embodiment, the implant is done after the trench has been filled with oxide and the surface polished back with chemical mechanical polishing (CMP). The nitride and oxide can be removed uniformly in the subsequent hot phosphoric acid strip leading to a more uniform and smaller STI step height. STI step height control is important for improved SRAM yield where transistors are densely packed together.

In accordance with yet another example, the one or more species of ions comprise one or more of argon, arsenic, antimony, indium, and germanium. The implantation of the one or more ion species into the secondary layer, in a preferred embodiment, comprises an ion implantation having a dosage of approximately $1 \times 10^{15}$ ions/cm$^2$ or greater, wherein the ion implantation is limited in depth to the secondary layer.

Thus, to the accomplishment of the foregoing and related ends, the disclosure comprises the features hereinafter fully described and particularly pointed out in the claims. The following description and the annexed drawings set forth in detail certain illustrative embodiments of the disclosure. These embodiments are indicative, however, of a few of the various ways in which the principles of the disclosure may be employed. Other objects, advantages and novel features of the disclosure will become apparent from the following detailed description of the invention when considered in conjunction with the drawings.

DETAILED DESCRIPTION OF THE INVENTION

Figure 1A:
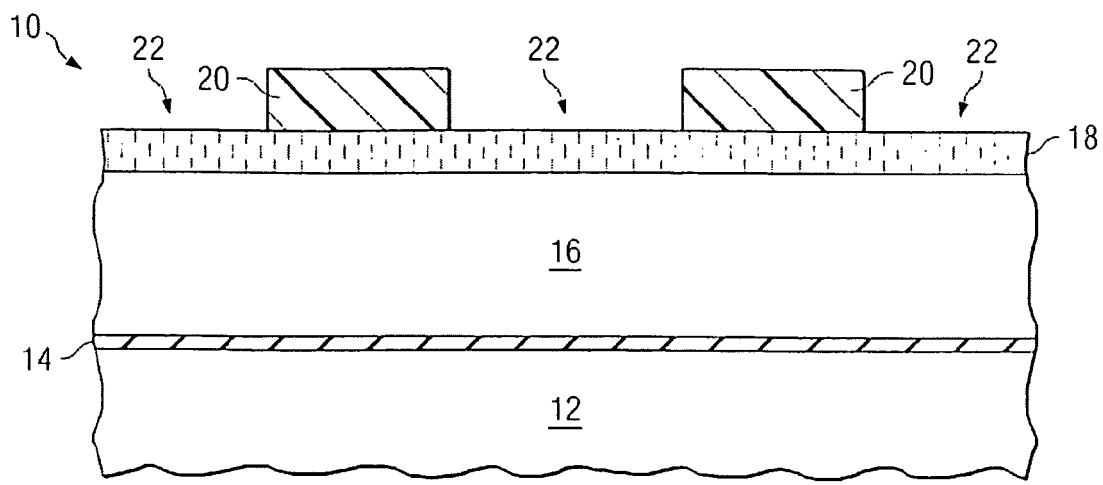
FIGS. 1A-1C illustrate several stages of conventional semiconductor processing wherein an IARC layer is utilized.
Figure 1B:
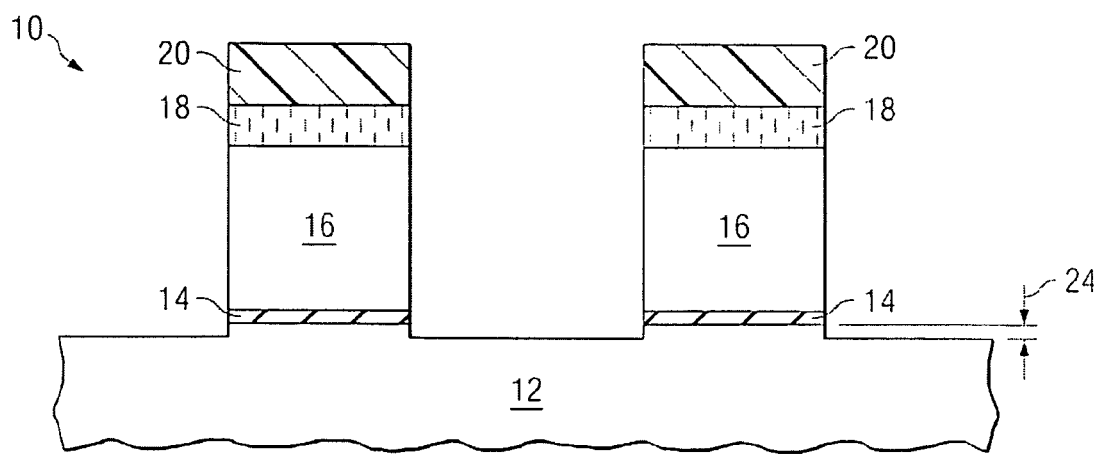
Figure 1C:
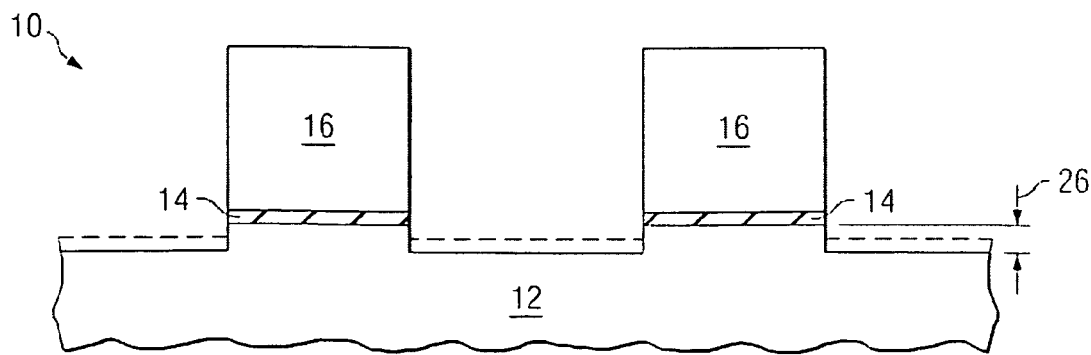
Figure 2A:
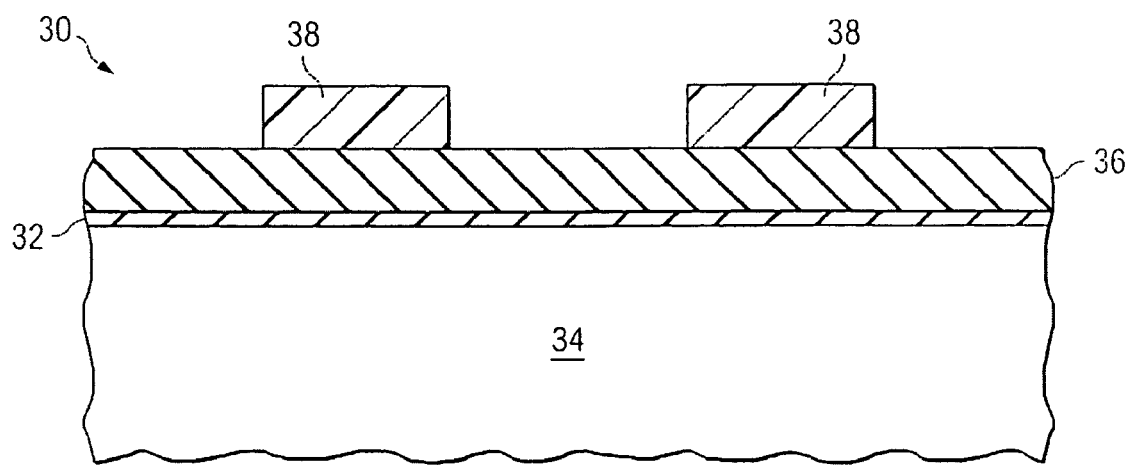
FIGS. 2A-2C illustrate several stages of conventional shallow trench isolation semiconductor processing.
Figure 2B:
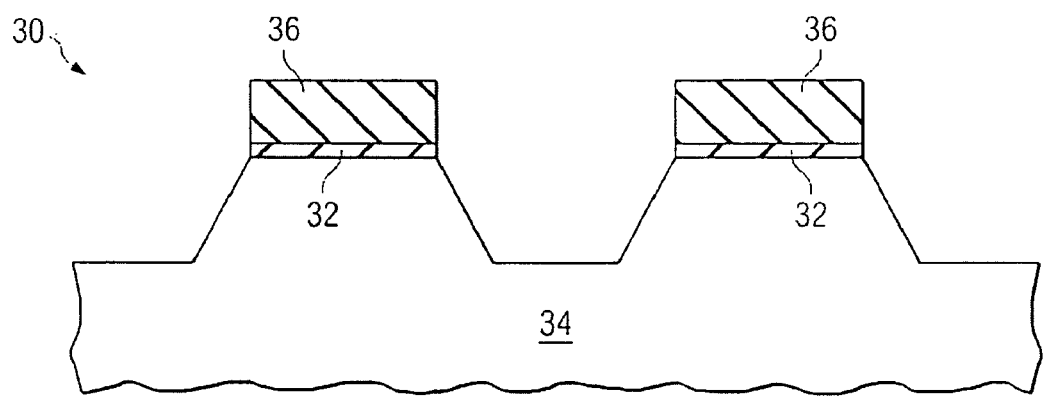
Figure 2C:
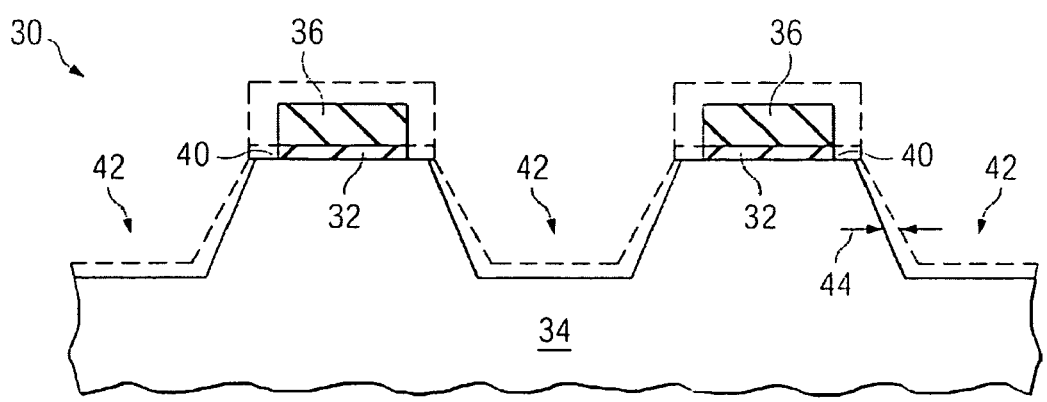

The present disclosure is generally directed towards a method for aiding removal of a layer formed during semiconductor processing of a workpiece. In particular, the present disclosure provides a method for structurally weakening the layer via an ion implantation, wherein the structural weakening of the layer generally increases a subsequent removal rate of the layer. Accordingly, the present disclosure will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present disclosure. It will be evident to one skilled in the art, however, that the present disclosure may be practiced without these specific details.

Figure 3:
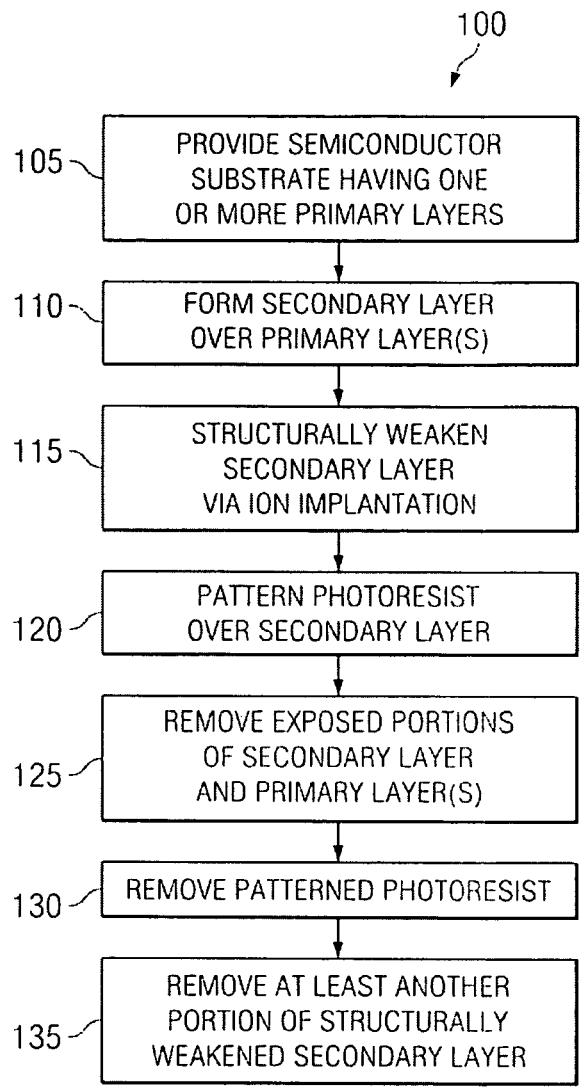
FIG. 3 illustrates a block diagram schematic of a method for semiconductor processing in accordance with one aspect of the present disclosure.

In accordance with the present disclosure, FIG. 3 illustrates a method 100 for semiconductor processing, wherein an ion implantation process is advantageously utilized to structurally weaken a layer in order to aid in a subsequent removal of at least a portion of the structurally weakened layer. While example methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present invention. Moreover, it will be appreciated that the methods may be implemented in association with the systems illustrated and described herein as well as in association with other systems not illustrated.

The method 100 begins with providing a semiconductor workpiece (e.g., a silicon substrate) having one or more primary layers formed thereon in act 105. A composition and number of the one or more primary layers can vary, depending on the desired resultant structure of the semiconductor process. In order to gain a better understanding of the disclosure, several example embodiments of the method 100 of FIG. 3 will be provided. However, it shall be understood that the present invention is not limited to the example embodiments, and other embodiments are also contemplated as falling within the scope of the present invention.

In a first embodiment, as illustrated in cross-section in FIGS. 4A-4F, for example, a first workpiece 200 is illustrated undergoing CMOS processing. As provided in act 105 of FIG. 3, one or more primary layers 205 are provided overlying a semiconductor substrate 210 in FIG. 4A. The one or more primary layers 205, for example, comprise a polysilicon layer 215 formed over an oxide layer 220, such as a gate oxide layer 222. Various techniques may be utilized for formation of the one or more primary layers 205, and such techniques are known in the art of semiconductor processing and will not be described in further detail.

Referring again to FIG. 3, a secondary layer is formed over the one or more primary layers in act 110. In the first embodiment illustrated in FIG. 4B, for example, a secondary layer 225 is illustrated as being formed over the one or more primary layers 205. In the first embodiment, the secondary layer comprises an antireflective coating 227, such as an inorganic antireflective coating (IARC). The antireflective coating 227, for example, comprises one or more of silicon nitride, silicon oxy-nitride, and silicon carbo-nitride that is deposited over the polysilicon layer 215 in act 110 of FIG. 3.

Figure 4A:
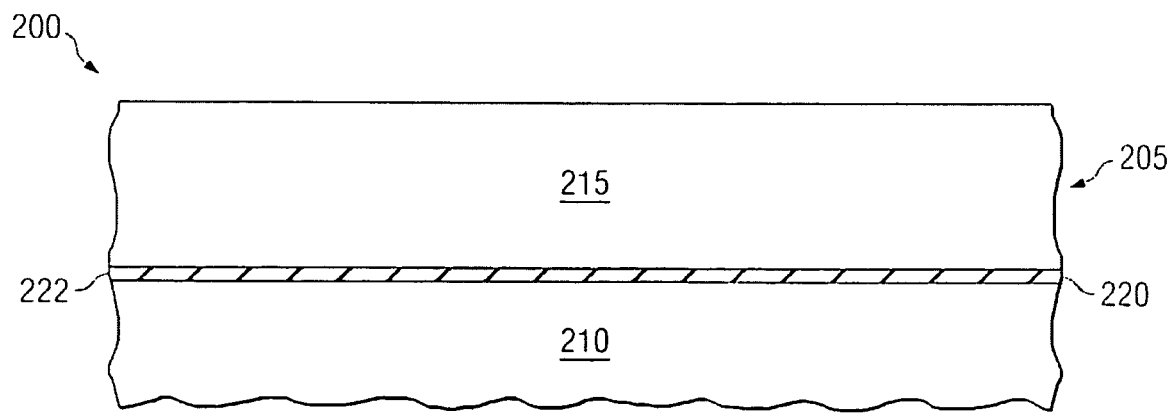
FIGS. 4A-4F illustrate various stages of processing of a workpiece in accordance with a first embodiment of the present disclosure.
Figure 4B:
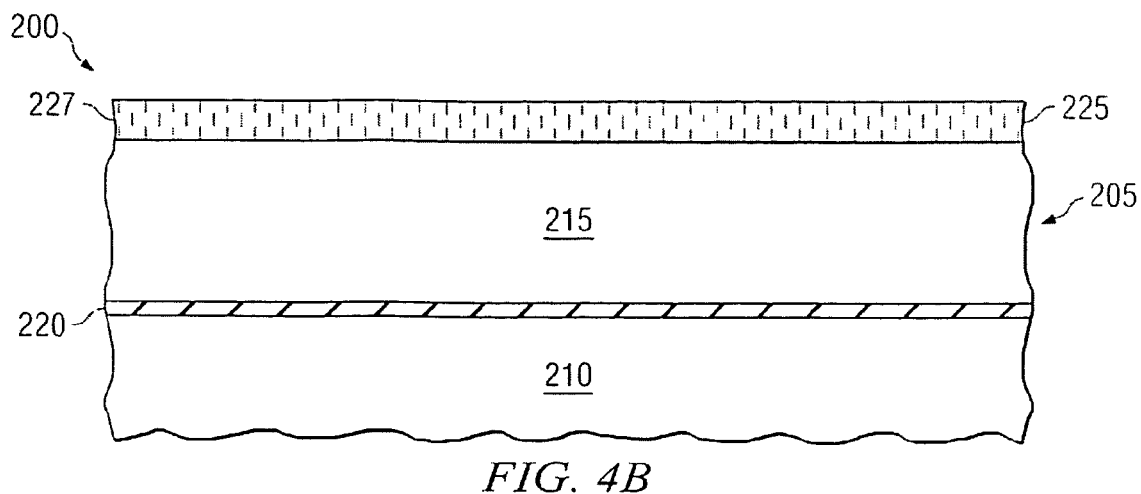
Figure 4C:
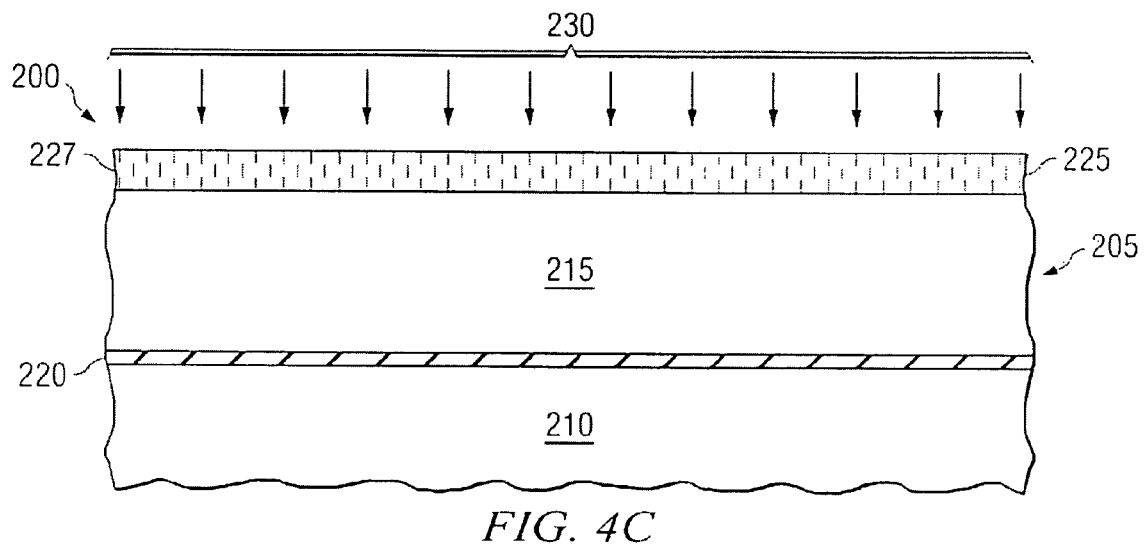

In accordance with the disclosure, one or more ions species are implanted into the secondary layer in act 115 of FIG. 3, therein structurally weakening the secondary layer. The one or more ion species, for example, comprise one or more of argon, arsenic, antimony, indium, and germanium. Alternatively, any heavy ion species may be implanted into the secondary layer in act 115, wherein the species, energy, and dosage of the ion implantation structurally weakens the secondary layer while maintaining various other properties of the secondary layer. For example, FIG. 4C illustrates the ion implantation 230, wherein various properties of the secondary layer 225 are generally maintained (e.g., antireflective properties of the antireflective coating 227) while structurally weakening the secondary layer with heavy ions, and wherein the ion implantation is further generally limited to within the secondary layer, thus not affecting various properties of underlying layers. The species, energy, and dosage of the ion implantation of act 115 of FIG. 3 is thus selected such that the ion implantation is generally contained within the secondary layer, while further structurally weakening the secondary layer. For example, the ion implantation of act 115 has a dosage of approximately $1 \times 10^{15}$ ions/cm$^2$ or greater, while the energy of the ion implantation selected to limited its depth to the secondary layer.

The dosage of the ion implantation, for example, is selected such that the dosage is substantial to cause structural damage in the desired layer. Accordingly, by selecting the species, energy, and dosage of the ion implantation, properties of the one or more primary layers and semiconductor substrate remain generally unaffected, while the ion implantation still provides a substantial structural weakening of the secondary layer.

Figure 4D:
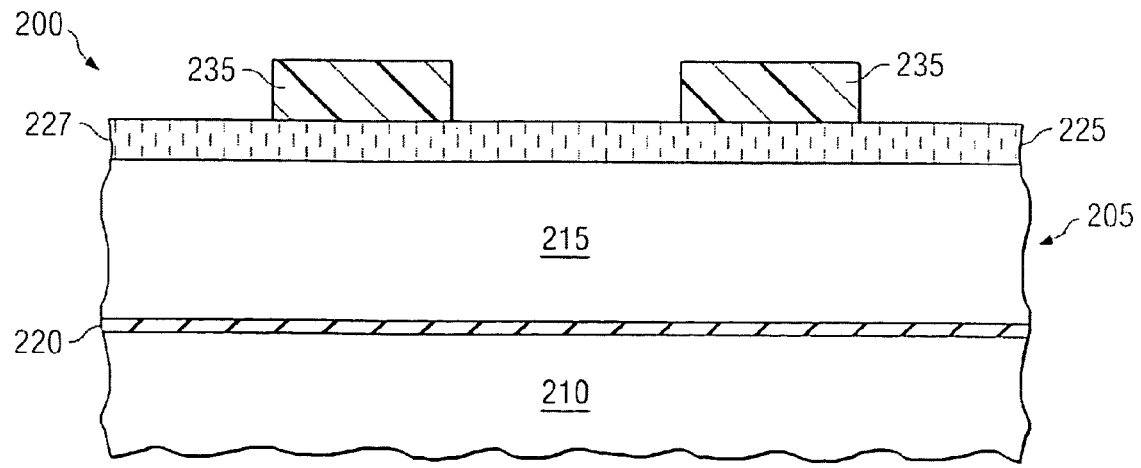
Figure 4E:
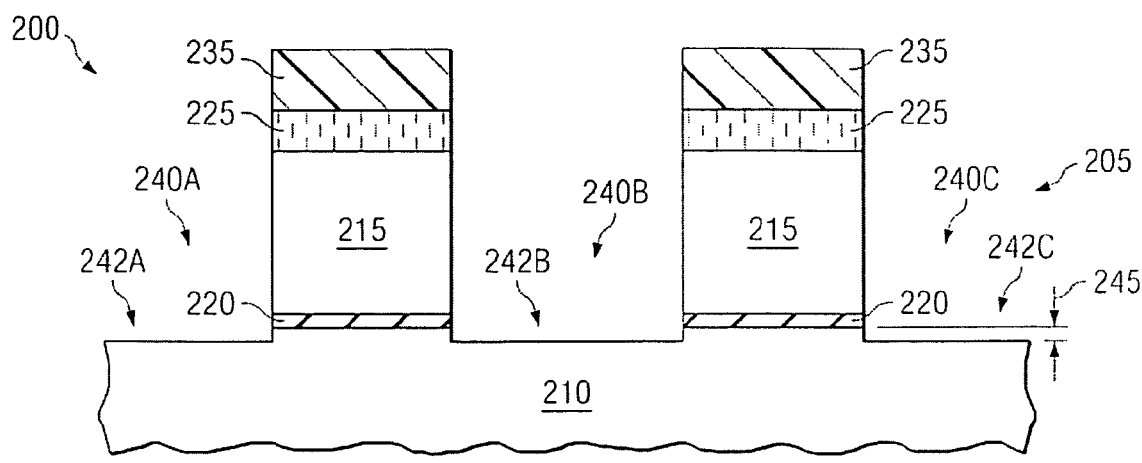

Again referring to FIG. 3, a patterned photoresist layer is formed over the secondary layer in act 120. FIG. 4D illustrates the result of patterning a photoresist layer 235 over the secondary layer 225 according to the first embodiment. In act 125 of FIG. 3, respective portions of the secondary layer and the one or more primary layers that are not covered by the patterned photoresist layer are then removed, such as by a wet or dry etch process. For example, FIG. 4E illustrates the result of performing act 125 in the first embodiment, wherein portions 240A-240C of secondary layer 225 and one or more primary layers 205 (e.g., respective portions of the polysilicon layer 215 and the oxide layer 220) that were not covered by the patterned photoresist layer 235 have been removed. Further, in the present example, at least a portion 242A-242C of the semiconductor substrate 210 that is not covered by the patterned photoresist layer 235 is further removed in act 125 of FIG. 3. In the present example, the semiconductor substrate 210 of FIG. 4E has been etched (e.g., a "gate etch") to a first depth 245 of approximately 10 to 20 angstroms in order to generally assure adequate removal of the portions 240A-240C of the one or more primary layers 205 not covered by the patterned photoresist layer 235.

Figure 4F:
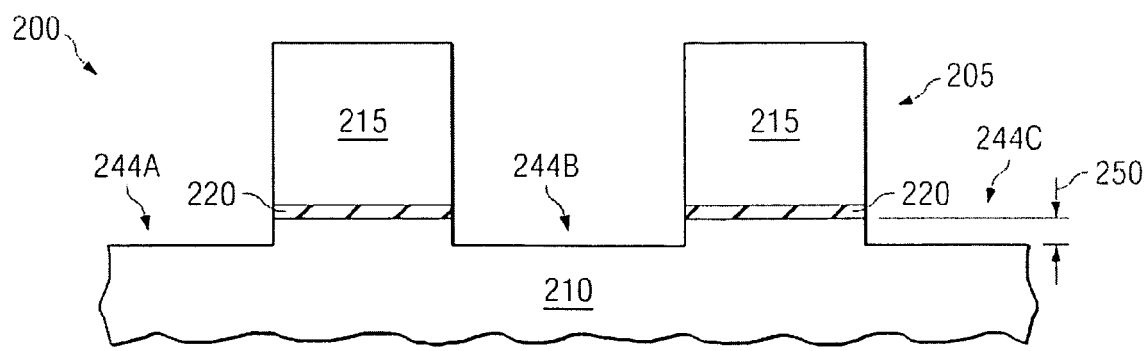

Accordingly, the patterned photoresist layer 235 is removed in act 130 of FIG. 3, and at least another portion of the secondary layer is further removed in act 135. The removal of at least another portion of the secondary layer in act 135, for example, may be accomplished by a hot phosphoric acid etch or other wet etch process. In the first embodiment, the result of act 135 is illustrated in FIG. 4F, wherein all of the secondary layer 225 of FIG. 4E is removed (e.g., an "IARC strip" process). In the present example, the removal of the secondary layer 225 in act 135 further removes of the semiconductor substrate 210. However, due to the structural weakening of the secondary layer 225 from the ion implantation of act 115 of FIG. 3, the removal rate of the secondary layer is significantly increased, thus advantageously limiting a removal of the at least another portion 244A-244C of the semiconductor substrate 210 to a second depth 250 (e.g., approximately 20 to 30 angstroms), as illustrated in FIG. 4F.

Thus, according to the present disclosure, the structural weakening of the secondary layer caused by the ion implantation of act 115 of FIG. 3 advantageously increases a removal rate of the secondary layer in both of acts 125 and 135, thus limiting a removal of active semiconductor substrate 210. The increased etch rate thus provides advantages over conventional processing, such as decreased removal of active areas of the semiconductor substrate, wherein performance characteristics of resultant devices (e.g., transistors) produced by the disclosed method are increased.

Figure 5A:
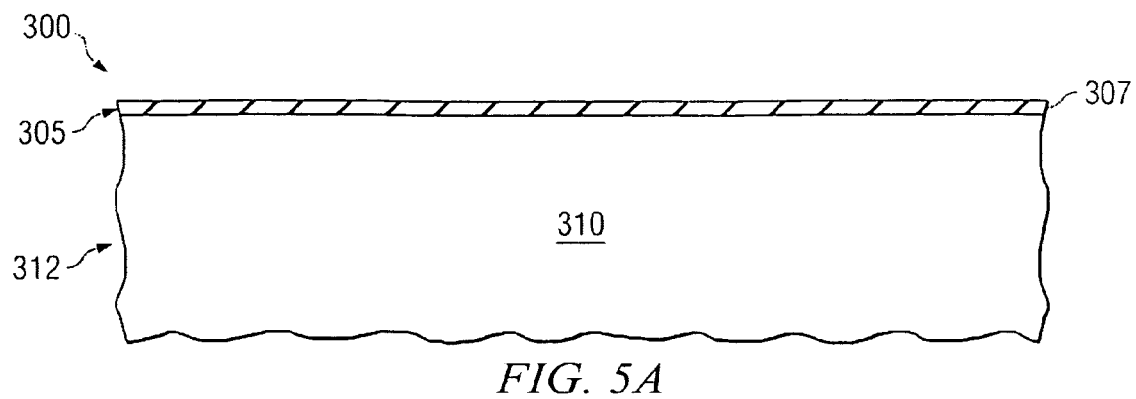
FIGS. 5A-5F illustrate various stages of processing of a workpiece in accordance with a second embodiment of the present disclosure.
Figure 5B:
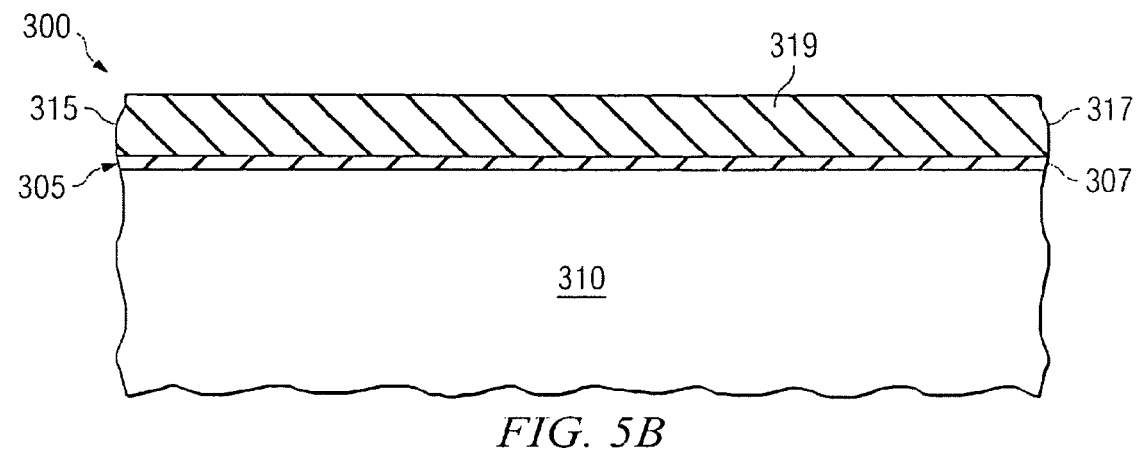

FIGS. 5A-5F illustrate cross-sectional views of a second workpiece 300 undergoing semiconductor processing according to a second embodiment of the disclosure, such as a shallow trench isolation (STI) process. For example, the one or more primary layers provided in act 105 of FIG. 3 is illustrated in FIG. 5A as an oxide layer 305, such as a pad oxide layer 307, being provided over a semiconductor substrate 310, such as a silicon workpiece 312. In the second embodiment, illustrated in FIG. 5B, a secondary layer 315 is formed over the oxide layer 305 in act 110 of FIG. 3, wherein the secondary layer comprises a nitride layer 317, such as SiN or SiON that is deposited over the oxide layer. In the present example, the nitride layer 317 comprises a shallow trench isolation nitride layer 319.

Figure 5C:
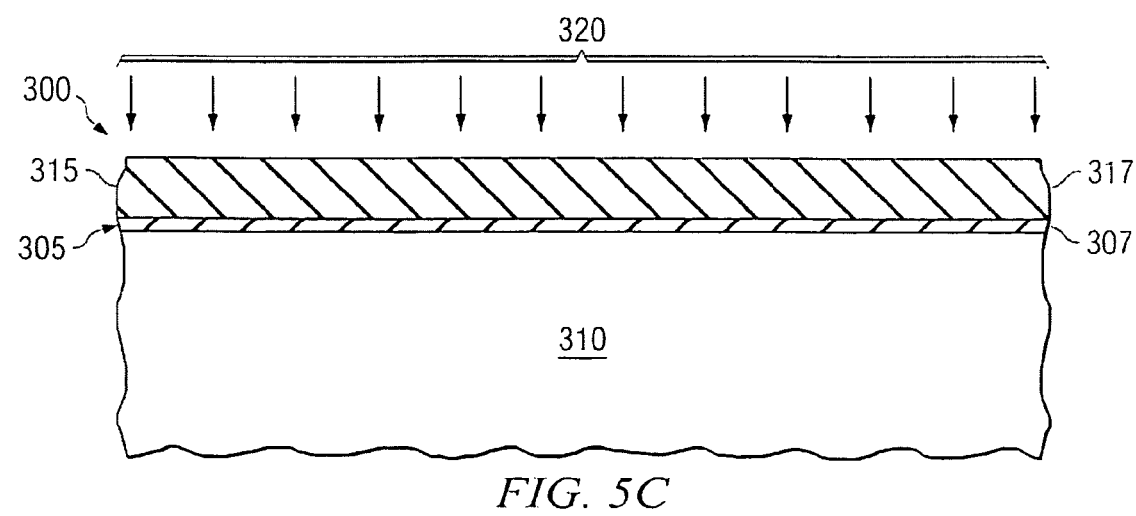

In FIG. 5C, one or more ions species are implanted 320 into the nitride layer 317, therein structurally weakening the secondary layer as described in act 115 of FIG. 3. Similar to the first embodiment, for example, the one or more ion species implanted in the second embodiment comprise one or more of argon, arsenic, antimony, indium, and germanium, or any other heavy ion species, wherein the species, energy, and dosage of the ion implantation structurally weakens the nitride layer while maintaining various other properties of the secondary layer. Again, the species, energy, and dosage of the ion implantation of act 115 of FIG. 3 is selected such that the ion implantation is generally contained within the secondary layer 315 of FIG. 5C, while the structural integrity of the secondary layer is substantially weakened, and wherein ion implantation is generally limited in depth to within the secondary layer.

Figure 5D:
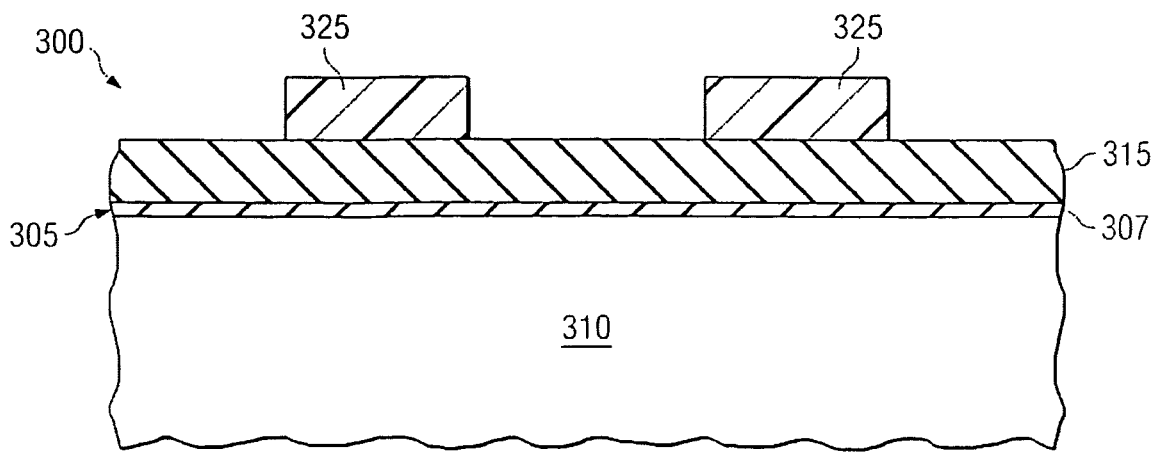
Figure 5E:
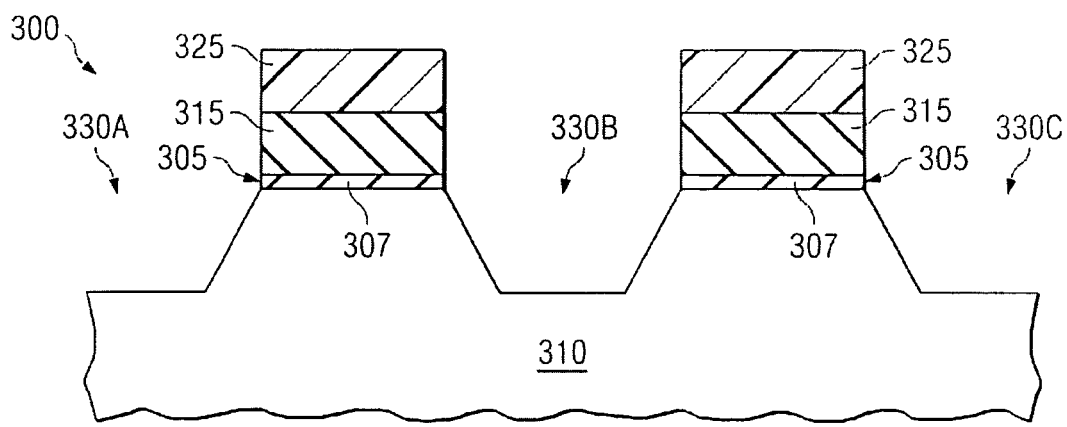

Act 120 of FIG. 3 is illustrated in the second embodiment in FIG. 5D, wherein a patterned photoresist layer 325 is formed over the secondary layer 315. The result of act 125 of FIG. 3 is illustrated in FIG. 5E for the second embodiment, wherein respective portions 330A-330C of the secondary layer 315 and the one or more primary layers 305 that are not covered by the patterned photoresist layer 325 have been removed, such as by a wet or dry etch. It should be noted that the semiconductor substrate 310 is further etched in act 125, as illustrated in FIG. 5E. In act 130 of FIG. 3, the patterned photoresist layer 325 is further removed, and in act 135, at least another portion of the secondary layer is removed, wherein the structural weakening of the secondary layer caused by the ion implantation further advantageously increases the removal rate of the at least another portion of the secondary layer.

Figure 5F:
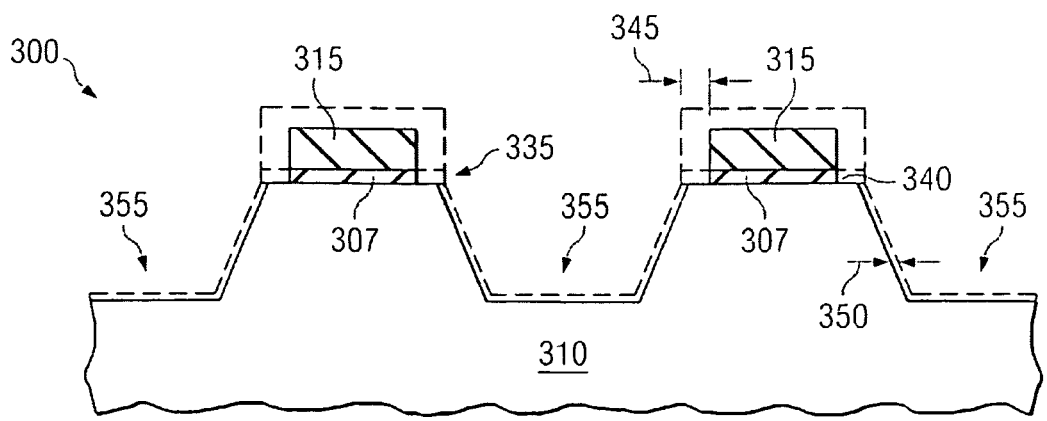

As illustrated in FIG. 5F, removing at least another portion of the secondary layer comprises undercutting the pad oxide layer 307 a predetermined amount 335 using diluted hydrofluoric acid to expose corners 340 of the semiconductor substrate 310. In accordance with another exemplary aspect, the removal of at least another portion of the secondary layer 315 that was previously covered by the patterned photoresist layer 325 of FIG. 5E comprises etching the nitride layer 317 a predetermined amount 345 with hot phosphoric acid (e.g., a "nitride pull-back"). Again, the structural weakening of the nitride layer 317 caused by the ion implantation of act 115 of FIG. 3 further advantageously increases the removal rate during the nitride pull-back, wherein an amount of time needed to attain the predetermined amount 345 of nitride pull-back is significantly reduced, thus decreasing a loss 350 of semiconductor substrate 310 in FIG. 5F compared to conventional processing. Accordingly, critical dimensions in active regions 355 of the semiconductor substrate 310 can be maintained at a more acceptable level than previously possible.

Furthermore, subsequent processing of the workpiece 300 may be performed after the at least a portion of the nitride layer 317 is removed, wherein an annealing of the remaining nitride layer can be performed to again structurally strengthen the nitride layer. Such a strengthening of the nitride layer 317 thus facilitates the nitride layer to again act as a stop for subsequent chemical mechanical polishing of the workpiece.

Figure 6A:
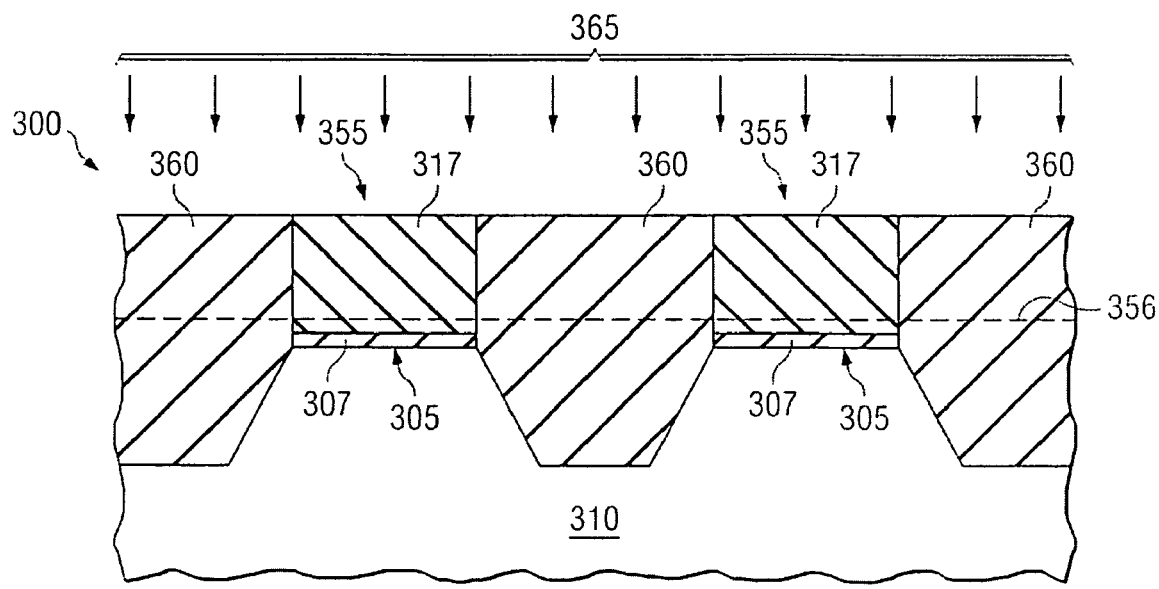
FIGS. 6A-6B illustrate various stages of processing of a workpiece in accordance with a third embodiment of the present disclosure.
Figure 6B:
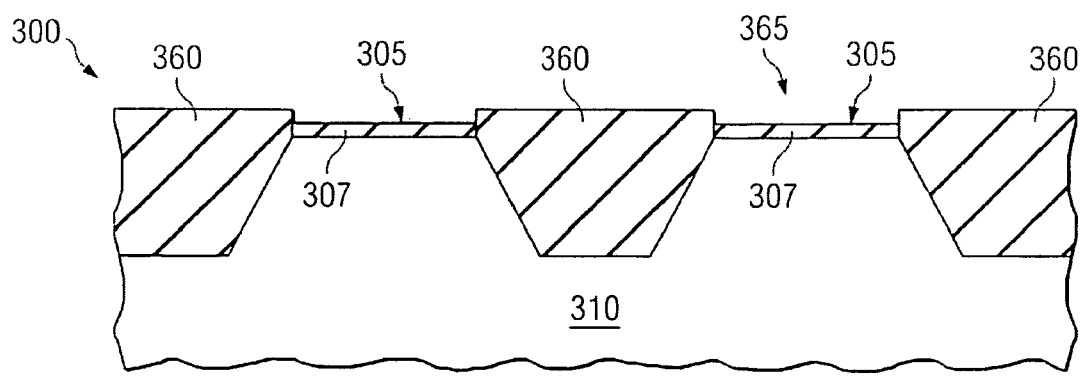

In yet another alternative embodiment, the ion implantation 115 of FIG. 3 is performed after the trench has been filled with oxide and the surface polished back with chemical mechanical polishing (CMP), as illustrated in FIG. 6A. A portion 355 (above the dashed line 356) of the nitride layer 317 and an STI fill oxide 360 can be damaged from the ion implantation 365 and removed uniformly in the subsequent hot phosphoric acid strip leading to a more uniform and smaller STI step height, as illustrated in FIG. 6B. Control of the STI step height is important, for example, for improved SRAM yield where transistors are densely packed together.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, "exemplary" as utilized herein merely means an example, rather than the best.

What is claimed is:

1. A method for semiconductor processing, the method comprising:
   providing a semiconductor substrate having one or more primary layers formed thereon;
   forming a secondary layer over the one or more primary layers;
   implanting one or more ions species into the secondary layer, therein structurally weakening the secondary layer;

forming a patterned photoresist layer over the secondary layer;

removing respective portions of the secondary layer and the one or more primary layers that are not covered by the patterned photoresist layer;

removing the patterned photoresist layer; and removing at least another portion of the secondary layer, wherein the structural weakening of the secondary layer caused by the ion implantation increases a removal rate of the at least another portion of the secondary layer.

2. The method of claim 1, wherein the one or more primary layers comprise a polysilicon layer formed over an oxide layer.

3. The method of claim 2, wherein the oxide layer comprises a gate oxide layer and the secondary layer comprises an antireflective coating.

4. The method of claim 3, wherein the antireflective coating comprises an inorganic antireflective coating.

5. The method of claim 2, wherein removing at least another portion of the secondary layer comprises removing all of the secondary layer.

6. The method of claim 1, wherein removing at least another portion of the secondary layer comprises etching at least the secondary layer with hot phosphoric acid.

7. The method of claim 1, wherein the one or more ion species comprise one or more of argon, arsenic, antimony, indium, and germanium.

8. The method of claim 1, wherein implanting the one or more ion species into the secondary layer comprises an ion implantation having a dosage of approximately $1 \times 10^{15}$ ions/cm$^2$ or greater, and wherein the ion implantation is limited in depth to the secondary layer.

9. The method of claim 1, wherein removing respective portions of the secondary layer and the one or more primary layers that are not covered by the patterned photoresist layer further comprises removing at least a portion of the semiconductor substrate not covered by the patterned photoresist layer.

10. The method of claim 1, wherein removing at least another portion of the secondary layer further comprises removing at least another portion of the one or more primary layers and at least another portion of the semiconductor substrate.

11. The method of claim 1, wherein the secondary layer comprises a nitride layer.

12. The method of claim 11, wherein the nitride layer comprises a shallow trench isolation nitride layer, and wherein the one or more primary layers comprise a pad oxide layer.

13. The method of claim 12, wherein removing at least another portion of the secondary layer comprises undercutting the pad oxide layer a predetermined amount using diluted hydrofluoric acid.

14. The method of claim 1, wherein removing at least another portion of the secondary layer comprises etching the secondary layer a predetermined amount with hot phosphoric acid.

15. A method for semiconductor processing, the method comprising:

providing a workpiece having one or more layers formed thereon;

forming a secondary layer over the one or more layers;

implanting one or more ions species into the secondary layer, therein substantially structurally weakening the secondary layer while substantially maintaining one or more properties associated therewith;

forming a patterned photoresist layer over the secondary layer;

removing portions of the secondary layer and one or more layers that are not covered by the patterned photoresist layer;

removing the patterned photoresist layer; and removing at least a portion of the secondary layer that was previously covered by the patterned photoresist layer, wherein the weakening caused by the ion implantation aids in the removal of the at least a portion of the secondary layer.

16. The method of claim 15, wherein the secondary layer comprises an inorganic antireflective coating.

17. The method of claim 16, wherein removing portions of the secondary layer and one or more layers that are not covered by the patterned photoresist layer comprises removing the inorganic antireflective coating via an etch process.

18. The method of claim 15, wherein implanting the one or more ions species into the secondary layer comprises implanting one or more of argon, arsenic, antimony, indium, and germanium.

19. The method of claim 15, wherein the secondary layer comprises a shallow trench isolation nitride layer.

20. The method of claim 19, wherein the workpiece comprises a semiconductor substrate, and wherein removing portions of the secondary layer and one or more layers that are not covered by the patterned photoresist layer further comprises removing at least a portion of the semiconductor substrate not covered by the patterned photoresist layer.

21. The method of claim 20, wherein removing at least a portion of the secondary layer that was previously covered by the patterned photoresist layer further comprises removing at least another portion of the semiconductor substrate.

22. The method of claim 19, wherein at least one of the one or more layers comprises a pad oxide layer.

23. The method of claim 22, further comprising undercutting the pad oxide layer a predetermined amount using hydrofluoric acid.

24. The method of claim 19, further comprising annealing the secondary layer after the at least a portion of the secondary layer that was previously covered by the patterned photoresist layer is removed, therein structurally strengthening remaining portions of the secondary layer after removing the at least a portion of the secondary layer that was previously covered by the patterned photoresist layer.

25. The method of claim 15, wherein removing at least a portion of the secondary layer that was previously covered by the patterned photoresist layer comprises etching the secondary layer a predetermined amount with hot phosphoric acid.

26. A method for semiconductor processing, the method comprising:

providing a semiconductor substrate having one or more primary layers formed thereon;

forming one or more secondary layers over the one or more primary layers;

implanting one or more ions species into the one or more secondary layers, therein structurally weakening a portion of the one or more secondary layers; and removing at least a portion of the one or more secondary layers, wherein the structural weakening of the portion of the one or more secondary layers caused by the ion implantation increases a removal rate of the portion of the one or more secondary layers.

27. The method of claim 26, wherein the one or more secondary layers comprises one or more of a shallow trench isolation nitride layer and a shallow trench isolation oxide layer.

28. The method of claim 26, wherein the one or more primary layers comprise a pad oxide layer.

29. The method of claim 26, wherein removing at least the portion of the one or more secondary layers comprises etching at least the portion of the one or more secondary layers with hot phosphoric acid.

* * * * *